United States Patent
Lee et al.

(10) Patent No.: US 11,205,601 B2
(45) Date of Patent: Dec. 21, 2021

(54) SEMICONDUCTOR PACKAGE AND SEMICONDUCTOR APPARATUS

(71) Applicant: Samsung Electronics Co., Ltd., Suwon-si (KR)

(72) Inventors: Eung chang Lee, Daejeon (KR); Heeyoub Kang, Seoul (KR); Haejung Yang, Suwon-si (KR); Youngrok Oh, Seoul (KR); Kitaek Lee, Hwaseong-si (KR); Bong jae Lee, Daejeon (KR)

(73) Assignees: SAMSUNG ELECTRONICS CO., LTD., Suwon-si (KR); Korea Advanced Institute Of Science And Technology, Daejeon (KR)

( * ) Notice: Subject to any disclaimer, the term of this patent is extended or adjusted under 35 U.S.C. 154(b) by 74 days.

(21) Appl. No.: 16/747,404

(22) Filed: Jan. 20, 2020

(65) Prior Publication Data
US 2020/0395256 A1 Dec. 17, 2020

(30) Foreign Application Priority Data
Jun. 17, 2019 (KR) ........................ 10-2019-0071776

(51) Int. Cl.
| | |
|---|---|
| *H01L 23/29* | (2006.01) |
| *H01L 23/367* | (2006.01) |
| *H01L 23/31* | (2006.01) |
| *H01L 21/56* | (2006.01) |
| *H01L 21/48* | (2006.01) |
| *C08G 77/04* | (2006.01) |

(52) U.S. Cl.
CPC ........ *H01L 23/296* (2013.01); *H01L 21/4871* (2013.01); *H01L 21/565* (2013.01); *H01L 21/568* (2013.01); *H01L 23/3128* (2013.01); *H01L 23/367* (2013.01); *C08G 77/04* (2013.01)

(58) Field of Classification Search
CPC . H01L 23/296; H01L 23/3128; H01L 23/367; H01L 21/4871; H01L 21/565; H01L 21/568; C08G 77/04
See application file for complete search history.

(56) References Cited

U.S. PATENT DOCUMENTS

| | | | |
|---|---|---|---|
| 8,492,753 | B2 | 7/2013 | Yager |
| 9,070,660 | B2 | 6/2015 | Lowe et al. |
| 9,562,814 | B2 | 2/2017 | Kulkarni et al. |
| 2002/0053399 | A1 | 5/2002 | Soane et al. |
| 2006/0237537 | A1 | 10/2006 | Empedocles et al. |

(Continued)

OTHER PUBLICATIONS

Aaswath P. Raman, Marc Abou Anoma, Linxiao Zhu, Eden Rephaeli & Shanhui Fan, "Passive radiative cooling below ambient air temperature under direct sunlight," Nature, Nov. 27, 2014, vol. 515, Macmillan Publishers Ltd., pp. 540-544 (11 pages).

(Continued)

*Primary Examiner* — Peniel M Gumedzoe
(74) *Attorney, Agent, or Firm* — Muir Patent Law, PLLC

(57) ABSTRACT

A semiconductor package includes a semiconductor chip and a polydimethylsiloxane (PDMS) layer that is provided on the semiconductor chip and of which upper surface is exposed to the outside. Since the semiconductor package may include the PDMS layer, heat emitting performance of the semiconductor package in a vacuum state may improve.

20 Claims, 12 Drawing Sheets

(56) References Cited

U.S. PATENT DOCUMENTS

| | | | |
|---|---|---|---|
| 2015/0115474 A1* | 4/2015 | Pham | H01L 24/80 |
| | | | 257/777 |
| 2015/0208923 A1 | 7/2015 | Akl et al. | |
| 2016/0259473 A1 | 9/2016 | Kim et al. | |
| 2016/0343686 A1* | 11/2016 | Kong | G02C 11/10 |
| 2017/0181275 A1* | 6/2017 | Dias | H05K 1/0393 |
| 2019/0067640 A1 | 2/2019 | Dong | |
| 2020/0294883 A1* | 9/2020 | Dede | H01L 23/24 |

OTHER PUBLICATIONS

Arvind Srinivasan, Braden Czapla, Jeff Mayo, Arvind Narayanasway, "Infrared dielectric function of polydimethylsiloxane and selective emission behavior," Applied Physics Letters, vol. 109, 061905, 2016 (4 pages).

Shinichiro Tsuda, Makoto Shimizu, Fumitada Iguchi, Hiroo Yugami, "Enhanced thermal transport in polymers with an infrared-selective thermal emitter for electronics cooling," Applied Thermal Engineering, Feb. 25, 2017, vol. 113, pp. 112-119 (8 pages).

Arvind Srinivasan, Braden Czapla, Jeff Mayo, Arvind Narayanasway, "Infrared dielectric function of polydimethylsiloxane and selective emission behavior," Applied Physics Letters, vol. 109, 061905, 2016 (7 pages).

* cited by examiner

SEMICONDUCTOR PACKAGE AND SEMICONDUCTOR APPARATUS

CROSS-REFERENCE TO RELATED APPLICATION

This application claims the benefit of Korean Patent Application No. 10-2019-0071776, filed on Jun. 17, 2019, in the Korean Intellectual Property Office, the disclosure of which is incorporated herein in its entirety by reference.

BACKGROUND

The inventive concept relates to a semiconductor package and a semiconductor apparatus, and more particularly, to a semiconductor package and a semiconductor apparatus having high thermal radiation performance in a vacuum state.

It is desirable that a storage capacity of a semiconductor chip be high and a semiconductor apparatus including the semiconductor chip be thin and light. Since the semiconductor chip generates a large amount of heat, performance of emitting heat to the outside of the semiconductor apparatus is essential to securing operation stability and product reliability of the semiconductor apparatus.

In addition, recently, semiconductor apparatuses are widely used for apparatuses operated in vacuum states such as a spacecraft, a space station, and a satellite. Therefore, improved heat emitting performance of the semiconductor apparatus in the vacuum state is desirable.

SUMMARY

The inventive concept provides a semiconductor package and a semiconductor apparatus having high heat emitting performance in a vacuum state.

The inventive concept provides a semiconductor package and a semiconductor apparatus having high electric insulation and endurance.

According to an aspect of the inventive concept, the disclosures is directed to a semiconductor package comprising: a semiconductor chip; and a polydimethylsiloxane (PDMS) layer that is provided on the semiconductor chip, wherein an upper surface of the PDMS layer is exposed to the outside of the semiconductor package.

According to an aspect of the inventive concept, the disclosures is directed to a semiconductor package comprising: a semiconductor chip; a heat sink on the semiconductor chip; and a polydimethylsiloxane (PDMS) layer that is provided on the heat sink, wherein an upper surface of the PDMS layer is exposed to the outside of the semiconductor package.

According to an aspect of the inventive concept, the disclosures is directed to a semiconductor apparatus comprising: a substrate; semiconductor chips mounted on the substrate; a controller mounted on the substrate and configured to control the semiconductor chips; a housing configured to surround the semiconductor chips and the controller; and an internal polydimethylsiloxane (PDMS) layer on an internal wall of the housing.

The semiconductor package and the semiconductor apparatus according to the inventive concept include a polydimethylsiloxane (PDMS) layer and may have high heat emitting performance in the vacuum state.

In addition, the semiconductor package and the semiconductor apparatus according to the inventive concept include the polydimethylsiloxane (PDMS) layer and may have high electric insulation and endurance.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
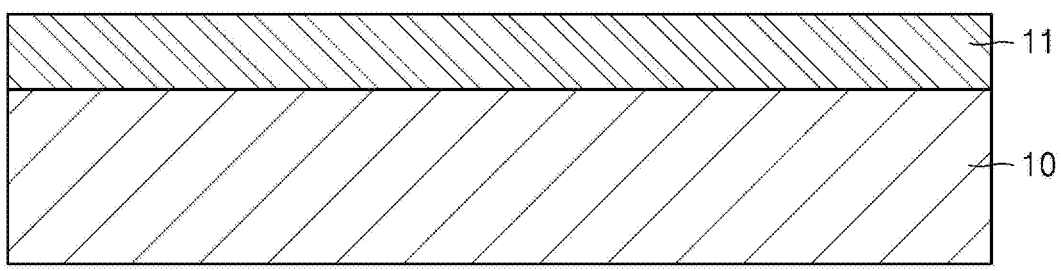
FIG. 1 is a cross-sectional view of a semiconductor package according to a comparative example.

Hereinafter, embodiments of the inventive concept will be described in detail with reference to the accompanying drawings. In the drawings, like numbers refer to like elements throughout.

FIG. 1 is a cross-sectional view of a semiconductor package 100 according to a comparative example. The semiconductor package 100 may include a semiconductor chip 10 and a heat sink 11.

Referring to FIG. 1, the heat sink 11 may be provided on the semiconductor chip 10. The heat sink 11 is configured to emit heat generated by the semiconductor chip 10 to the outside of the semiconductor package 100. In addition, the heat sink 11 may include a metal material with high thermal conductivity. For example, the heat sink 11 may include at least one of metal materials with high thermal conductivity such as aluminum (Al), nickel (Ni), copper (Cu), magnesium (Mg), and silver (Ag).

When the heat sink 11 includes the metal material, thermal emissivity of the heat sink 11 may commonly have a value of about 0.2 to about 0.7 in an infrared (IR) period. The thermal emissivity may be defined by a ratio of radiant heat of an object to radiant heat on a surface of a blackbody. The thermal emissivity may be an indicator that represents efficiency of thermal energy emission caused by radiation on the surface of the object. For example, when the thermal emissivity of an object is higher, the object may emit a greater amount of thermal energy to the outside of the semiconductor package 100 by radiation. In an embodiment, when the heat sink 11 of the semiconductor package 100 includes Ni, the thermal emissivity of the heat sink 11 in the IR period may have a value of about 0.2 to about 0.4.

When the semiconductor package 100 in a comparative example includes the heat sink 11 formed of a metal material, the semiconductor package 100 may have weak light emitting performance in a vacuum state. The vacuum state may include a state in which the air does not exist or a low pressure state in which pressure of the air is no more than 1/1,000 mmHg. When the semiconductor chip 10 of the semiconductor package 100 operates in the vacuum state, a convective heat transfer phenomenon caused by the air may be extremely weak. Therefore, the heat emitting performance of the semiconductor package 100 including the heat sink 11 formed of the metal material may be weak in the vacuum state.

Figure 2:
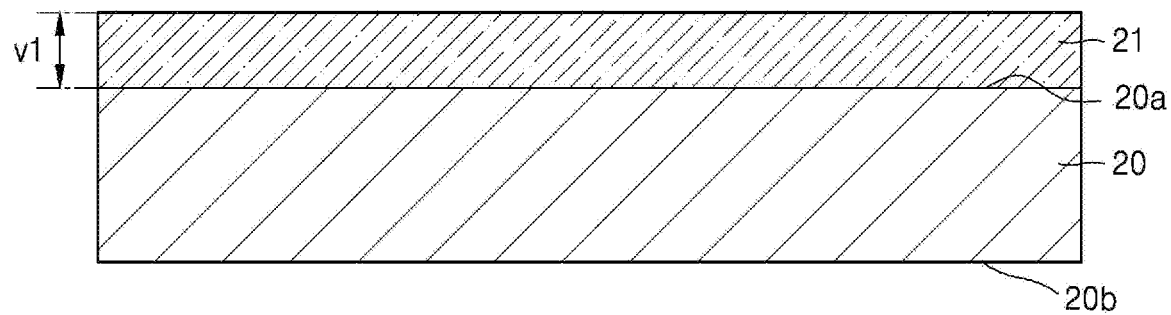
FIGS. 2 to 14 are cross-sectional views of semiconductor packages according to an example embodiment of the inventive concept.

FIG. 2 is a cross-sectional view of a semiconductor package 200 according to an example embodiment of the inventive concept. The semiconductor package 200 according to the inventive concept may include the semiconductor chip 20 and a polydimethylsiloxane (PDMS) layer 21.

In an embodiment, the semiconductor chip 20 according to the inventive concept may include a plurality of various kinds of individual devices. The plurality of various kinds of individual devices may include various micro-electronic devices, for example, a metal-oxide-semiconductor field effect transistor (MOSFET) such as, for example, a complementary metal-insulator-semiconductor (CMOS) transistor, an image sensor such as, for example, a system large scale integration (LSI) or a CMOS imaging sensor (CIS), a micro-electro-mechanical system (MEMS), an active device, and a passive device.

In an embodiment, the semiconductor chip 20 may include a memory semiconductor chip. The memory semiconductor chip may include a volatile memory semiconductor chip such as dynamic random access memory (DRAM) or static random access memory (SRAM) or a non-volatile memory semiconductor chip such as phase-change random access memory (PRAM), magneto-resistive random access memory (MRAM), ferroelectric random access memory (FeRAM) or resistive random access memory (RRAM).

In addition, the semiconductor chip 20 may include a logic chip. For example, the semiconductor chip 20 may include a central processor unit (CPU), a micro-processor unit (MPU), a graphic processor unit (GPU) or an application processor (AP).

In an embodiment, the semiconductor package 200 is illustrated as including the one semiconductor chip 20. However, the semiconductor package 200 may include two or more semiconductor chips. The two or more semiconductor chips included in the semiconductor package 200 may be the same kind of semiconductor chips or different kinds of semiconductor chips. For example, the semiconductor package 200 may be a system in package (SIP) in which different kinds of semiconductor chips are electrically connected and operate as one system.

In an embodiment, the semiconductor chip 20 may include an upper surface 20a and a lower surface 20b. A chip pad (not shown) may be formed on the lower surface 20b of the semiconductor chip 20. The chip pad may be electrically connected to the plurality of various kinds of individual devices formed on the semiconductor chip 20. In addition, although not shown in FIG. 2, the semiconductor package 200 may further include a passivation layer that covers the lower surface 20b of the semiconductor chip 20.

In an embodiment, when the semiconductor chip 20 of the semiconductor package 200 operates, the semiconductor chip 20 may be heated and the heated semiconductor chip 20 may radiate an electromagnetic wave. For example, when the semiconductor chip 20 operates, the semiconductor chip 20 may be heated to about 70 degrees Celsius up to about 130 degrees Celsius and the semiconductor chip 20 may radiate an electromagnetic wave in the IR period. In addition, the semiconductor chip 20 may heat the PDMS layer 21 on the upper surface 20a by a thermal conduction.

In an embodiment, the PDMS layer 21 according to the inventive concept may be provided on the semiconductor chip 20 and an upper portion of the PDMS layer 21 may be exposed to the outside of the semiconductor package 200.

For example, a lower surface of the PDMS layer 21 may contact an upper surface of the semiconductor chip 20, and an upper surface of the PDMS layer 21 may be exposed to the outside of the semiconductor package 200. In addition, the PDMS layer 21 may be an inorganic polymer layer including a chemical structure of $[C_2H_6OSi]_n$.

In an embodiment, the PDMS layer 21 may be attached onto the upper surface 20a of the semiconductor chip 20. Side surfaces of the PDMS layer 21 may be exposed to the outside of the semiconductor package 200 as illustrated in FIG. 2 or may be self-aligned with side surfaces of the semiconductor chip 20. The inventive concept is not limited thereto. In some embodiments, the side surfaces of the PDMS layer 21 may be provided on inner sides in comparison with the side surfaces of the semiconductor chip 20 and the upper surface of the PDMS layer 21 may occupy an area smaller than that of the upper surface of the semiconductor chip 20. For example, when viewed from the top down, the side surfaces of the PDMS layer 21 may be positioned within a perimeter formed by the side surfaces of the semiconductor chip 20, and the PDMS layer 21 may have a smaller area than that of the semiconductor chip 20.

In an embodiment, the PDMS layer 21 may be formed to a thickness v1 in which thermal emissivity has a value of about 0.6 to about 1 in the IR period. In more detail, when the semiconductor chip 20 of the semiconductor package 200 operates in the vacuum state, the thickness v1 of the PDMS layer 21 may be determined so that the thermal emissivity of the PDMS layer 21 in the IR period has the value of about 0.6 to about 1.

In addition, when the semiconductor chip 20 of the semiconductor package 200 operates in the vacuum state, the thickness v1 of the PDMS layer 21 may be determined so that the thermal emissivity of the PDMS layer 21 in the IR period has a greater value than thermal emissivity in another period (for example, in a visible ray period or ultraviolet (UV) period).

In an embodiment, the PDMS layer 21 may be formed to a thickness v1 of about 1 micrometer to about 300 micrometers. In more detail, the PDMS layer 21 may be formed to a thickness v1 of about 1 micrometer to about 200 micrometers. When the PDMS layer 21 is formed to the above thickness v1 and the semiconductor chip 20 of the semiconductor package 200 operates in the vacuum state, the PDMS layer 21 may have the thermal emissivity of the value of about 0.6 to about 1 in the IR period. For example, when the PDMS layer 21 is formed to the thickness v1 of about 1 micrometer to about 300 micrometers and the semiconductor chip 20 of the semiconductor package 200 operates in the vacuum state, the PDMS layer 21 may have the thermal emissivity of the value of about 0.6 to about 1 in a period in which a wavelength of an electromagnetic wave is about 5 micrometers to about 15 micrometers.

In an embodiment, when the PDMS layer 21 is formed to the thickness v1, the heat emitting performance of the semiconductor package 200 including the PDMS layer 21 in the vacuum state may improve. When the semiconductor chip 10 of the semiconductor package 100 of a comparative example, which is described with reference to FIG. 1, operates in the vacuum state, the thermal emissivity of the heat sink 11 including Ni may be about 0.2 to about 0.4 in the IR period. However, when the semiconductor package 200 according to the inventive concept operates in the vacuum state, the thermal emissivity of the PDMS layer 21 may have the value of about 0.6 to about 1 in the IR period. Therefore, the thermal radiation performance of the semiconductor package 200 according to the inventive concept in the vacuum state may be about twice to about five times better than that of the semiconductor package 100 in the comparative example, which is described with reference to FIG. 1. For example, an amount of light radiated to the outside of the semiconductor package 200 by the PDMS layer 21 of the semiconductor package 200 according to the inventive concept may be greater than that of light radiated to the outside of the semiconductor package 200 by the heat sink 11 of the semiconductor package 100 of the comparative example. Therefore, since the semiconductor package 200 according to the inventive concept may efficiently emit light generated by the semiconductor chip 20 in the vacuum state, operation stability and product reliability of the semiconductor chip 20 may be secured.

In an embodiment, since viscosity of the PDMS layer 21 according to the inventive concept may be greater than that of common silicon rubber, the PDMS layer 21 may be stably attached to an upper portion of the semiconductor chip 20. Since an elastic coefficient of the PDMS layer 21 may be greater than that of common silicon rubber, the semiconductor package 200 including the PDMS layer 21 may be less damaged by external shock. For example, the semiconductor package 200 that includes the PDMS layer 21 may have greater resistance to damage caused by external shock. Since reactivity of the PDMS layer 21 to other chemical materials (for example, a chemical gas and a chemical solution) may be lower than that of common silicon rubber and electric insulation of the PDMS layer 21 may be higher than that of common silicon rubber, durability of the semiconductor package 200 may improve.

Figure 3:
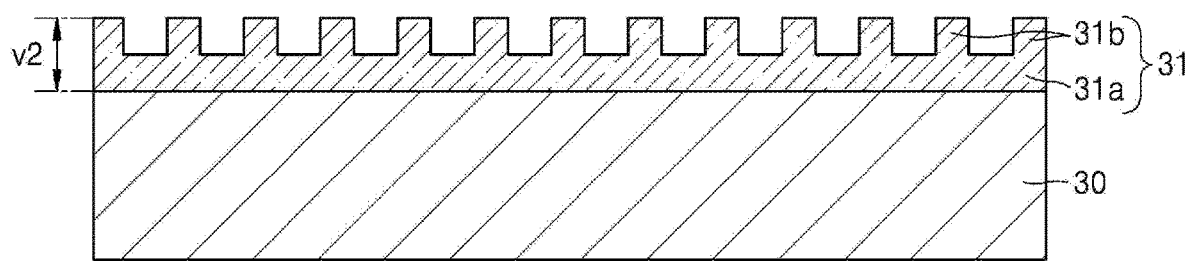

FIG. 3 is a cross-sectional view of a semiconductor package 300 according to an example embodiment of the inventive concept.

In an embodiment, the semiconductor package 300 may include a semiconductor chip 30 and a PDMS layer 31. Since the semiconductor chip 30 and the PDMS layer 31 may include the technical features described with reference to the semiconductor chip 20 and the PDMS layer 21 of FIG. 2, detailed description thereof is omitted.

In an embodiment, the PDMS layer 31 may have a concavo-convex structure. For example, the PDMS layer 31 may have a structure in which concaveness and convexity are repeated. As illustrated in FIG. 3, the PDMS layer 31 may include a base 31a and protrusions 31b that protrude from the base 31a. The PDMS layer 31 may have a surface area increased by the concavo-convex structure. For example, a surface area of an upper surface of the PDMS layer 31 may be greater than that of a lower surface of the PDMS layer 31.

In an example embodiment, the PDMS layer 31 may have the concavo-convex structure through a cutting process. For example, the concavo-convex PDMS layer 31 may be formed by etching a part of the rectangular parallelepiped PDMS layer 31 by a mechanical cutting process. The inventive concept is not limited thereto. The concavo-convex PDMS layer 31 may be formed by etching a part of the rectangular parallelepiped PDMS layer 31 by a chemical etching process or a photolithography process.

In an embodiment, the protrusions 31b of the PDMS layer 31 may protrude from the base 31a to be rectangular parallelepiped and upper portions of the protrusions 31b may include flat surfaces. In some embodiments, the flat surfaces of the protrusions 31b may be coplanar with one another. The inventive concept is not limited thereto. The upper portions of the protrusions 31b of the PDMS layer 31 may include convex surfaces. In some embodiments, uppermost surfaces of the convex surfaces may be at a same vertical height. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

In an embodiment, the PDMS layer 31 may be formed to a thickness v2 of about 1 micrometer to about 300 micrometers. For example, the sum of the thicknesses of the base 31a and the protrusion 31b of the PDMS layer 31 may be about 1 micrometer to about 300 micrometers. In more detail, the PDMS layer 31 may be formed to a thickness v2 of about 1 micrometer to about 200 micrometers. For example, the sum of the thicknesses of the base 31a and the protrusion 31b of the PDMS layer 31 may be about 1 micrometer to about 200 micrometers.

In an embodiment, the thermal emissivity of the concavo-convex PDMS layer 31 of FIG. 3 may have a greater value than the thermal emissivity of the PDMS layer 21 of FIG. 2. Therefore, the heat emitting performance of the semiconductor package 300 of FIG. 3 in the vacuum state may be higher than that of the semiconductor package 200 described with reference to FIG. 2 in the vacuum state.

Figure 4:
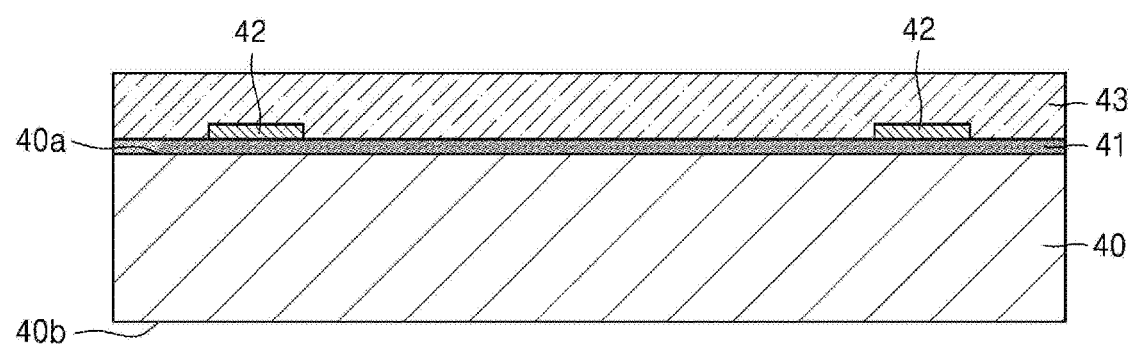

FIG. 4 is a cross-sectional view of a semiconductor package 400 according to an example embodiment of the inventive concept.

Referring to FIG. 4, the semiconductor package 400 may include a semiconductor chip 40, a primer 41, adhesives 42, and a PDMS layer 43. Since the technical features of the semiconductor chip 40 and the PDMS layer 43 may include the technical features described with reference to the semiconductor chip 20 and the PDMS layer 21, respectively, of FIG. 2, detailed description thereof is omitted.

In an embodiment, the primer 41 may be provided on an upper surface 40a of the semiconductor chip 40. The primer 41 may be coated on the upper surface 40a of the semiconductor chip 40 and may make a surface of the upper surface 40a of the semiconductor chip 40 even. For example, the primer 41 may fill any recesses in the upper surface 40a of the semiconductor chip 40. In some embodiments, an upper surface of the primer 41 may be planar. In addition, when the primer 41 is coated on the upper surface 40a of the semiconductor chip 40, the primer 41 may remove impurities on the upper surface 40a of the semiconductor chip 40. The PDMS layer 43 may be stably attached to the upper surface 40a of the semiconductor chip 40 by the primer 41.

In an embodiment, the adhesives 42 may attach the PDMS layer 43 onto the primer 41 and may be provided on an upper surface of the primer 41. The adhesives 42 may be buried in the PDMS layer 43. Therefore, the adhesives 42 may not be exposed to the outside of the semiconductor package 400. The adhesives 42 may include silicon adhesives. For example, the adhesives 42 may include thermoset silicon adhesives hardened when heat is applied.

In an embodiment, the PDMS layer 43 may be provided on the primer 41. In addition, the PDMS layer 43 may cover the adhesives 42 and may be firmly attached onto the primer 41 by the adhesives 42. For example, the PDMS layer 43 may surround upper and side surfaces of the adhesives 42, and lower surfaces of the adhesives 42 may contact the upper surface of the primer 41.

Figure 5:
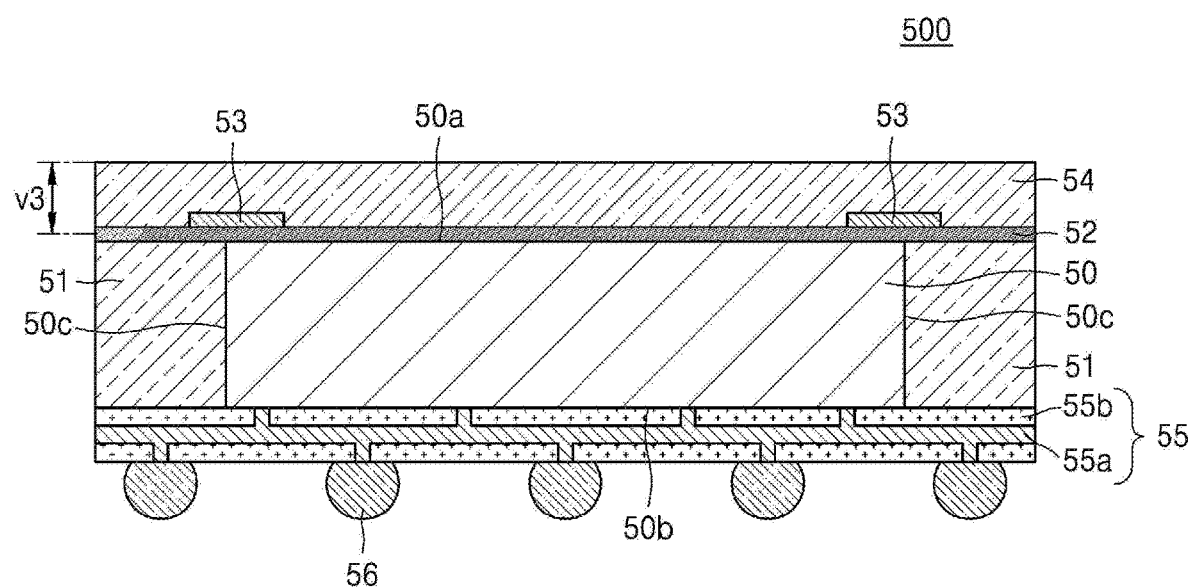

FIG. 5 is a semiconductor package 500 according to an example embodiment of the inventive concept. The semiconductor package 500 may include a semiconductor chip 50, molding materials 51, a primer 52, adhesives 53, a PDMS layer 54, a redistribution layer 55, and external connection terminals 56. Since the technical features of the semiconductor chip 50, the primer 52, the adhesives 53, and the PDMS layer 54 may include the technical features described with reference to the semiconductor chip 40, the primer 41, the adhesives 42, and the PDMS layer 43, respectively, of FIG. 4, detailed description thereof is omitted.

In an embodiment, the molding materials 51 may surround side surfaces 50c of the semiconductor chip 50. In some embodiments, the molding materials may contact the side surfaces 50c of the semiconductor chip 50. In addition, the molding materials 51 may protect the semiconductor chip 50 against external shock. The molding materials 51 may include a silicon based material, a thermoset material, a thermoplastic material, or an UV processed material, for example, an epoxy molding compound.

In an embodiment, as illustrated in FIG. 5, the molding materials 51 may cover the side surfaces 50c of the semiconductor chip 50 and may not cover an upper surface 50a of the semiconductor chip 50. For example, an upper surface of the molding materials 51 may be coplanar with the upper surface 50a of the semiconductor chip 50. The inventive concept is not limited thereto. The molding materials 51 may cover both the side surfaces 50c and the upper surface 50a of the semiconductor chip 50. In some embodiments, the molding materials may contact the side surfaces 50c and the upper surface 50a of the semiconductor chip 50.

In an embodiment, the redistribution layer 55 may be formed on a lower surface 50b of the semiconductor chip 50. The redistribution layer 55 may electrically connect a chip pad of the semiconductor chip 50 to the external connection terminals 56.

In an embodiment, the redistribution layer 55 may include a redistribution pattern 55a and an insulating layer 55b. The redistribution pattern 55a may be electrically connected to the chip pad (not shown) formed on the lower surface 50b of the semiconductor chip 50. In addition, the redistribution pattern 55a may provide an electrical connection path for electrically connecting the chip pad to an external apparatus. The insulating layer 55b may protect the redistribution pattern 55a that is electrically connected to the chip pad against external shock. For example, the insulating layer 55b may include at least one of a silicon oxide layer, a silicon nitride layer, and an insulating polymer.

In an embodiment, the external connection terminals 56 may be provided under the redistribution layer 55 and may be electrically connected to the redistribution pattern 55a of the redistribution layer 55. The external connection terminals 56 may provide paths through which the semiconductor package 500 may be electrically connected to the external apparatus. For example, the semiconductor package 500 may be electrically connected to the external apparatus, such as a system substrate and a main board, by the external connection terminals 56. The external connection terminals 56 may include a solder ball. The solder ball may include a metal material such as tin (Sn), silver (Ag), copper (Cu), or aluminum (Al). The external connection terminals 56 may be ball-shaped. However, the inventive concept is not limited thereto. The external connection terminals 56 may be cylindrical, faceted cylindrical, or polyhedral.

In an embodiment, the PDMS layer 54 may be formed to a thickness v3 in which the thermal emissivity has a value of about 0.6 to about 1 in the IR period. In more detail, when the semiconductor chip 50 of the semiconductor package 500 operates in the vacuum state, the thickness v3 of the PDMS layer 54 may be determined so that the thermal emissivity of the PDMS layer 54 in the IR period has the value of about 0.6 to about 1. For example, the thickness v3 of the PDMS layer 54 may be determined so that the thermal emissivity of the PDMS layer 54 has the value of about 0.6 to about 1 in a period in which the wavelength of the electromagnetic wave is about 5 micrometers to about 15 micrometers.

In an embodiment, when the PDMS layer 54 is formed to the thickness v3 of about 1 micrometer to about 300 micrometers, the PDMS layer 54 may have the thermal emissivity with the value of about 0.6 to about 1 in the period in which the wavelength of the electromagnetic wave is about 5 micrometers to about 15 micrometers. In more detail, the PDMS layer 54 may have the thickness v3 of about 1 micrometer to about 200 micrometers.

In an embodiment, an area of a lower surface of the PDMS layer 54 may be greater than that of the upper surface 50a of the semiconductor chip 50. For example, the area of the lower surface of the PDMS layer 54 may be actually equal to the sum of an area of the upper surface 50a of the semiconductor chip 50 and areas of upper surfaces of the molding materials 51. For example, when viewed from the top down, the PDMS layer 54 may have an area that is the same as the combined areas of the upper surface 50a of the semiconductor chip 50 and the upper surfaces of the molding materials 51. In addition, side surfaces of the PDMS layer 54 may be self-aligned with those of the semiconductor package 500.

Since the semiconductor package 500 includes the PDMS layer 54, the semiconductor package 500 may have high heat emitting performance, electric insulation, and durability in the vacuum state.

Figure 6:
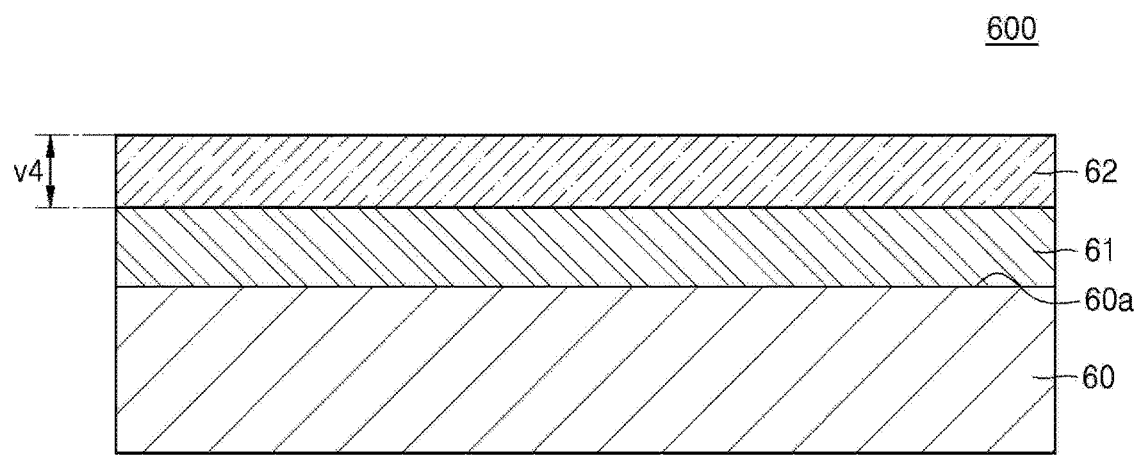

FIG. 6 is a cross-sectional view of a semiconductor package 600 according to an example embodiment of the inventive concept. The semiconductor package 600 may include a semiconductor chip 60, a heat sink 61, and a PDMS layer 62. Since the technical features of the semiconductor chip 60 are the same as those described with reference to the semiconductor chip 10 of FIG. 1, detailed description thereof is omitted.

In an embodiment, the heat sink 61 may be provided on the semiconductor chip 60. For example, the heat sink 61 may be attached to an upper surface 60a of the semiconductor chip 60 by an adhesive film (not shown). Heat generated by the semiconductor chip 60 may be transmitted to the heat sink 61 by the thermal conduction phenomenon.

In an embodiment, the heat sink 61 may include a metal material. For example, the heat sink 61 may include at least one metal material of Al, Mg, Cu, Ni, and Ag. The inventive concept is not limited thereto. The heat sink 61 may include at least one material of a ceramic material, a carbon material, and a polymer material with high thermal conductivity.

As illustrated in FIG. 6, side surfaces of the heat sink 61 may be self-aligned with those of the semiconductor chip 60. In addition, an area of a lower surface of the heat sink 61 may be actually equal to that of an upper surface of the semiconductor chip 60. The inventive concept is not limited thereto. The side surfaces of the heat sink 61 may be positioned on inner sides in comparison with the side surfaces of the semiconductor chip 60. For example, the side surfaces of the heat sink 61 may be positioned within a perimeter formed by the side surfaces of the semiconductor chip 60, the lower surface of the heat sink 61 may occupy an area that is smaller than that of the upper surface of the semiconductor chip 60.

In an embodiment, the PDMS layer 62 may be provided on the heat sink 61 and an upper portion of the PDMS layer 62 may be exposed to the outside of the semiconductor package 600. For example, an upper surface of the PDMS layer 62 may be exposed to the outside of the semiconductor package 600. Side surfaces of the PDMS layer 62 may be self-aligned with those of the heat sink 61. In addition, an area of a lower surface of the PDMS layer 62 may be equal to that of an upper surface of the heat sink 61.

In an embodiment, the PDMS layer 62 may be formed to a thickness v4 in which the thermal emissivity has a value of about 0.7 to about 1 in the IR period. In more detail, when the semiconductor chip 60 of the semiconductor package 600 operates in the vacuum state, the thickness v4 of the PDMS layer 62 may be determined so that the thermal emissivity of the PDMS layer 62 has a value of about 0.7 to about 1 in the IR period.

In an embodiment, when the PDMS layer 62 is provided on the heat sink 61 to the thickness v4 of about 1 micrometer to about 300 micrometers and the semiconductor package 600 operates in the vacuum state, the PDMS layer 62 may have the thermal emissivity with the value of about 0.7 to about 1 in a period in which the wavelength of the electromagnetic wave is about 5 micrometers to about 15 micrometers. In more detail, the PDMS layer 62 may have the thickness v4 of about 1 micrometer to about 200 micrometers.

In an embodiment, since the semiconductor package 600 may include the heat sink 61 interposed between the semiconductor chip 60 and the PDMS layer 62, when the semiconductor chip 60 of the semiconductor package 600 operates, the thermal emissivity of the PDMS layer 62 may have the value of about 0.7 to about 1 in the period in which the wavelength of the electromagnetic wave is about 5 micrometers to about 15 micrometers.

The thermal emissivity of the PDMS layer 62 of the semiconductor package 600 of FIG. 6 may have a greater value than the thermal emissivity of the PDMS layer 21 of the semiconductor package 200. Therefore, heat emitting performance of the semiconductor package 600 of FIG. 6 in the vacuum state may be higher than that of the semiconductor package 200 of FIG. 2 in the vacuum state. The heat emitting performances of the semiconductor packages 200 and 600 in the vacuum state will be described in more detail later with reference to the graph of FIG. 10.

In an embodiment, the semiconductor package 600 includes the PDMS layer 62 and may have high light emitting performance in the vacuum state as described above. In addition, when the semiconductor chip 60 of the semiconductor package 600 operates under atmospheric pressure, heat generated by the semiconductor chip 60 may be emitted to the outside of the semiconductor package 600 by the convective heat transfer phenomenon of the heat sink 61. Therefore, the heat emitting performance of the semiconductor package 600 under atmospheric pressure may also be high. In addition, the semiconductor package 600 includes the PDMS layer 62 and may have high electric insulation and durability.

Figure 7:
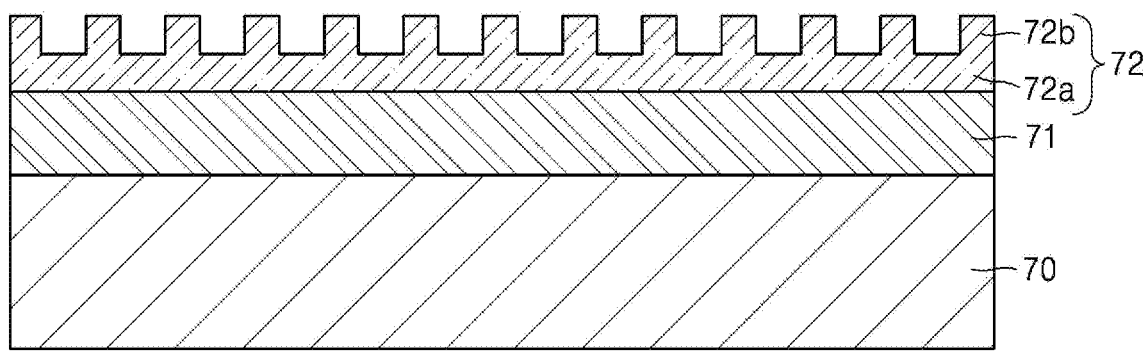

FIG. 7 is a cross-sectional view of a semiconductor package 700 according to an example embodiment of the inventive concept. The semiconductor package 700 may include a semiconductor chip 70, a heat sink 71, and a PDMS layer 72. Since the technical features of the semiconductor chip 70 and the PDMS layer 72 are the same as the technical features described with reference to the semiconductor chip 60 and the PDMS layer 62, respectively, of FIG. 1, detailed description thereof is omitted.

In an embodiment, the PDMS layer 72 may have a concavo-convex structure. For example, the PDMS layer 72 may have a structure in which concaveness and convexity are repeated. As illustrated in FIG. 7, the PDMS layer 72 may include a base 72a and protrusions 72b that protrude from the base 72a. Since the technical features of the PDMS layer 72 having the concavo-convex structure may be the same as the technical features of the PDMS layer 31 having the concavo-convex structure described with reference to FIG. 3, detailed description thereof is omitted.

In an embodiment, the thermal emissivity of the PDMS layer 72 having the concavo-convex structure of FIG. 7 may be higher than that of the PDMS layer 62 of FIG. 6. Therefore, the light emitting performance of the semiconductor package 700 of FIG. 7 in the vacuum state may be higher than that of the semiconductor package 600 described with reference to FIG. 6 in the vacuum state.

Figure 8:
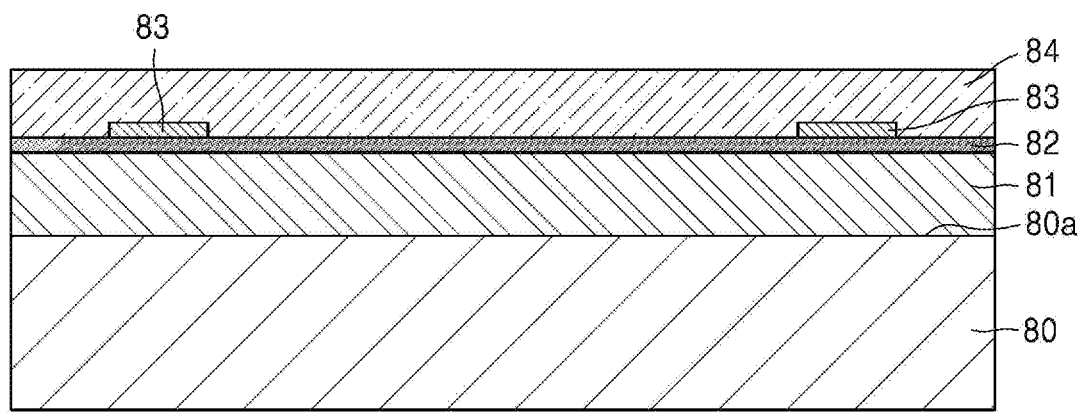

FIG. 8 is a cross-sectional view of a semiconductor package 800 according to an embodiment of the inventive concept. The semiconductor package 800 may include a semiconductor chip 80, a heat sink 81, a primer 82, adhesives 83, and a PDMS layer 84.

In an embodiment, the heat sink 81 may be provided on an upper surface 80a of the semiconductor chip 80 and the primer 82 may be provided on an upper surface of the heat sink 81. The primer 82 is coated on the upper surface of the heat sink 81 and may make a surface of the upper surface of the heat sink 81 even. For example, the primer 82 may fill any recesses in the upper surface of the heat sink 81. In addition, when the primer 82 is coated on the upper surface of the heat sink 81, the primer 82 may remove impurities on the upper surface of the heat sink 81.

Since the technical features of the semiconductor chip 80, the primer 82, the adhesives 83, and the PDMS layer 84 of the semiconductor package 800 are the same as the technical features described with reference to the semiconductor chip 40, the primer 41, the adhesives 42, and the PDMS layer 43, respectively, of FIG. 4, detailed description thereof is omitted.

Figure 9:
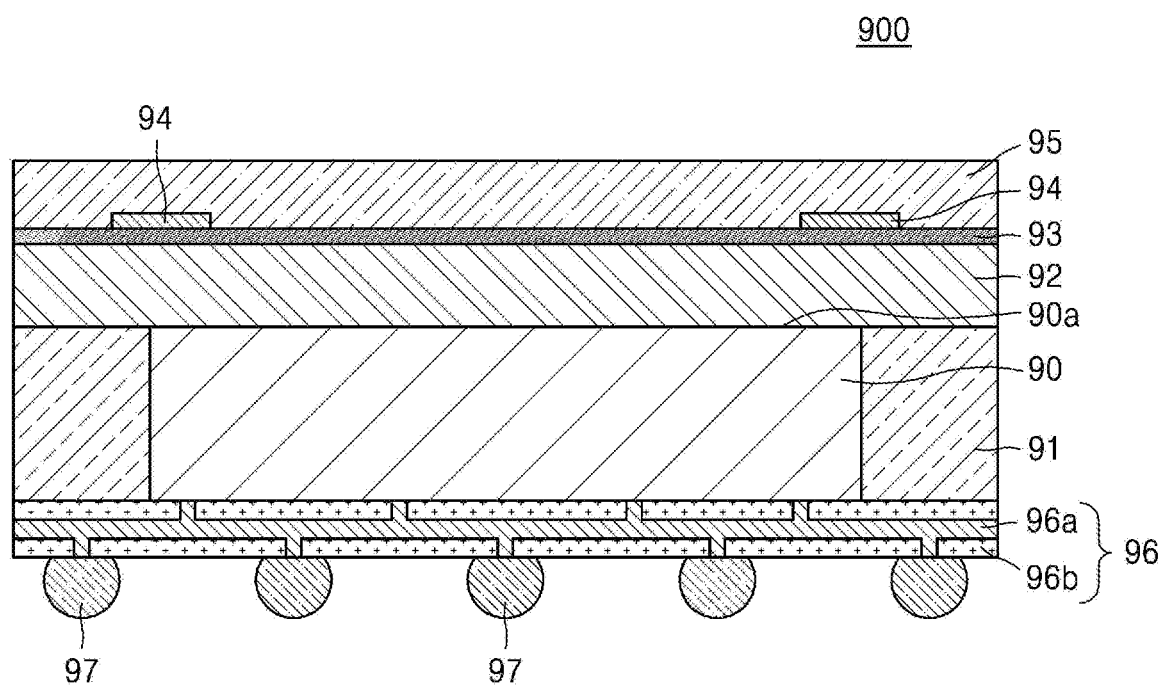

FIG. 9 is a cross-sectional view of a semiconductor package 900 according to an example embodiment of the inventive concept. The semiconductor package 900 may include a semiconductor chip 90, molding materials 91, a heat sink 92, a primer 93, adhesives 94, a PDMS layer 95, a redistribution layer 96, and external connection terminals 97.

In an embodiment, an area of a lower surface of the heat sink 92 may be greater than that of an upper surface 90a of the semiconductor chip 90. For example, the area of the lower surface of the heat sink 92 may be actually equal to the sum of an area of the upper surface 90a of the semiconductor chip 90 and areas of upper surfaces of the molding materials 91. Side surfaces of the heat sink 92 may be self-aligned with those of the semiconductor package 900.

In an embodiment, an area of a lower surface of the PDMS layer 95 may be greater than that of the upper surface 90a of the semiconductor chip 90. In addition, an area of a lower surface of the PDMS layer 95 may be actually equal to that of an upper surface of the heat sink 92. Side surfaces of the PDMS layer 95 may be self-aligned with those of the semiconductor package 900.

Since the technical features of the semiconductor chip 90, the molding materials 91, the primer 93, the adhesives 94, the PDMS layer 95, the redistribution layer 96, and the external connection terminals 97 of the semiconductor package 900 may be the same as the technical features described with reference to the semiconductor chip 50, the molding materials 51, the primer 52, the adhesives 53, the PDMS layer 54, the redistribution layer 55, and the external connection terminals 56, respectively, of FIG. 5, detailed description thereof is omitted.

Figure 10:
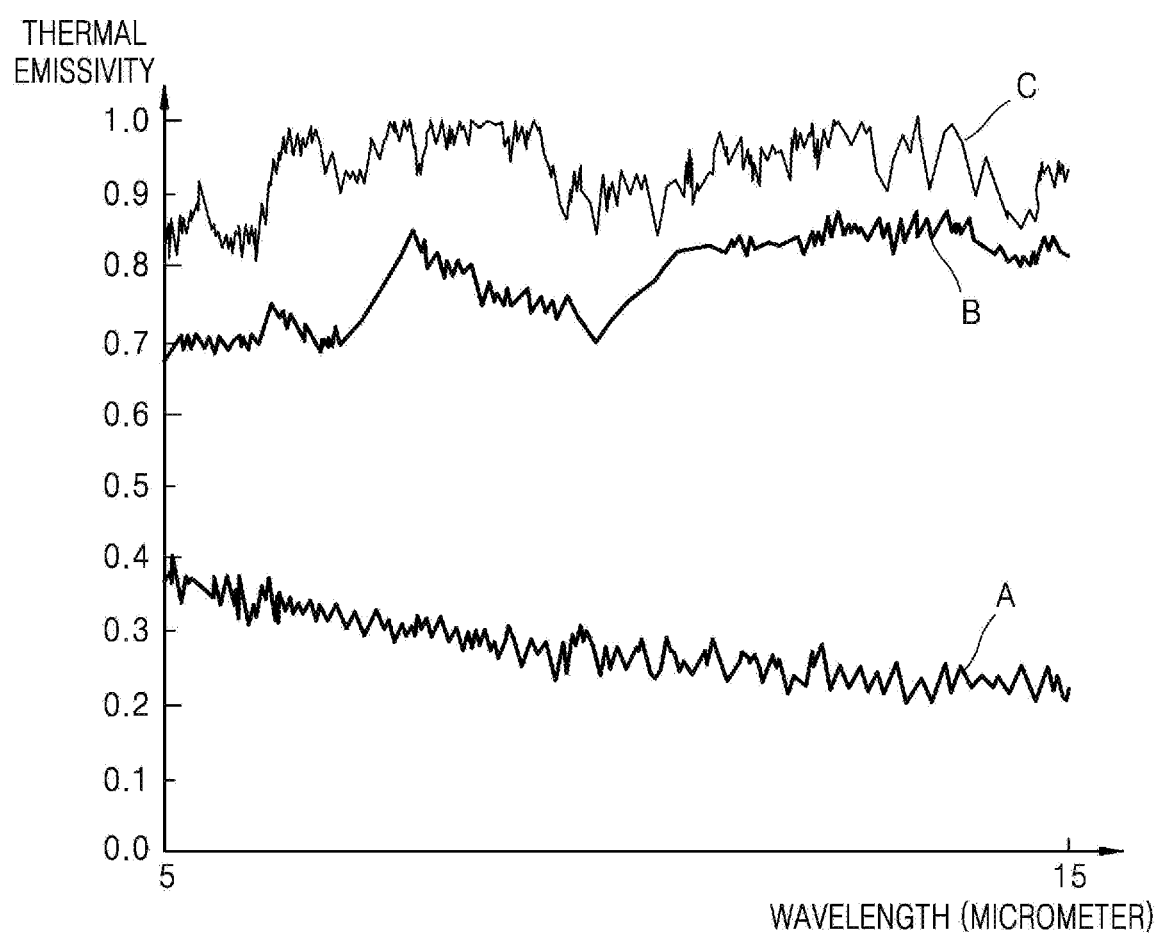

FIG. 10 is a graph illustrating heat emitting performances of semiconductor packages in the vacuum state according to the inventive concept. In more detail, the graph of FIG. 10 illustrates the heat emitting performances of the semiconductor package 100 of FIG. 1, the semiconductor package 200 of FIG. 2, and the semiconductor package 600 of FIG. 6 in the vacuum state. Line A of the graph illustrates thermal emissivity in a period in which a wavelength of an electromagnetic wave of the semiconductor package 100 of FIG. 1 is 5 micrometer to 15 micrometers. Line B of the graph illustrates thermal emissivity in a period in which a wavelength of an electromagnetic wave of the semiconductor package 200 of FIG. 2 is 5 micrometer to 15 micrometers. Line C of the graph illustrates thermal emissivity in a period in which a wavelength of an electromagnetic wave of the semiconductor package 600 of FIG. 6 is 5 micrometer to 15 micrometers.

An experiment for measuring the heat emitting performances of the semiconductor packages 100, 200, and 600 in the vacuum state is performed. In the experiment, performances and kinds of the semiconductor chips 10, 20, and 60 including the semiconductor packages 100, 200, and 600 are the same. In addition, in the experiment, a material, shape, and thickness of the heat sink 11 of the semiconductor package 100 of FIG. 1 are the same as those of the heat sink 61 of the semiconductor package 600 of FIG. 6. In addition, in the experiment, a material and shape of the PDMS layer 21 of the semiconductor package 200 are the same as those of the PDMS layer 62 of the semiconductor package 600. In the experiment, the PDMS layer 21 of the semiconductor package 200 of FIG. 2 and the PDMS layer 62 of the semiconductor package 600 of FIG. 6 are formed to the same thickness in a range of about 1 micrometer to about 300 micrometers.

The heat emitting performances of the semiconductor packages 100, 200, and 600 in the vacuum state are obtained by measuring thermal emissivity in the IR period of the heat sink 11 or the PDMS layers 21 and 62 of the semiconductor packages 100, 200, and 600 by an IR polarizer after operating the semiconductor packages 100, 200, and 600 in the vacuum state.

Referring to FIG. 10, when the semiconductor chip 10 of the semiconductor package 100 in the comparative example of FIG. 1 operates in the vacuum state, the heat sink 11 may have thermal emissivity of about 0.2 to about 0.4 in the period in which the wavelength of the electromagnetic wave is about 5 micrometers to about 15 micrometers.

When the semiconductor chip 20 of the semiconductor package 200 of FIG. 2 according to the inventive concept operates in the vacuum state, the PDMS layer 21 may have thermal emissivity of about 0.6 to about 1 in the period in which the wavelength of the electromagnetic wave is about 5 micrometers to about 15 micrometers.

When the semiconductor chip 60 of the semiconductor package 600 of FIG. 6 according to the inventive concept operates in the vacuum state, the PDMS layer 62 may have the thermal emissivity of about 0.7 to about 1 in the period in which the wavelength of the electromagnetic wave is about 5 micrometers to about 15 micrometers.

The heat emitting performances of the semiconductor packages 200 and 600 according to the inventive concept in the vacuum state may be higher than that of the semiconductor package 100 in the comparative example in the vacuum state. In more detail, the semiconductor packages 200 and 600 according to the inventive concept may have thermal emissivity about 1.5 times to about 5 times higher than that of the semiconductor package 100 in the comparative example in the period in which the wavelength of the electromagnetic wave is about 5 micrometers to about 15 micrometers.

In addition, since the semiconductor package 600 of FIG. 6 may further include the heat sink 61 interposed between the semiconductor chip 60 and the PDMS layer 62, the semiconductor package 600 of FIG. 6 may have thermal emissivity of a value greater than that of the thermal emissivity of the semiconductor package 200 of FIG. 2 in the period in which the wavelength of the electromagnetic wave is about 5 micrometers to about 15 micrometers.

Figure 11:
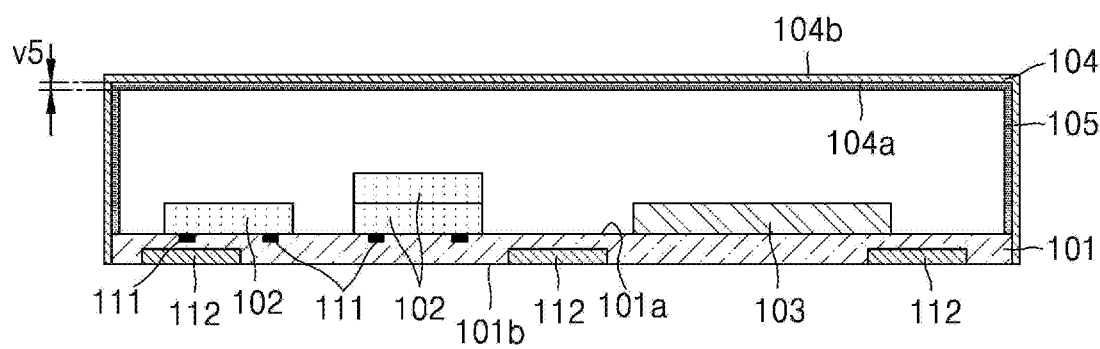

FIG. 11 is a cross-sectional view of a semiconductor apparatus 1100 according to an embodiment of the inventive concept. The semiconductor apparatus 1100 according to an embodiment of the inventive concept may include a storage apparatus. For example, the semiconductor apparatus 1100 may include main storage apparatuses such as random access memory (RAM) and read only memory (ROM). In addition, the semiconductor apparatus 1100 may include auxiliary storage apparatuses such as a hard disk drive (HDD) and a solid state drive (SSD).

In an embodiment, the semiconductor apparatus 1100 may be mounted in an apparatus operated in the vacuum state. In more detail, the semiconductor apparatus 1100 may be mounted in each of apparatuses operated in the vacuum state such as a spacecraft, a space station, and a satellite.

Referring to FIG. 11, the semiconductor apparatus 1100 may include a substrate 101, semiconductor chips 102, a controller 103, a housing 104, and an internal PDMS layer 105.

In an embodiment, the semiconductor chips 102 and the controller 103 may be mounted on an upper surface 101a of the substrate 101 and may be electrically connected to the substrate 101. The substrate 101 may include a printed circuit board (PCB) including at least one material of silicon, phenol resin, epoxy resin, and polyimide.

In an embodiment, upper substrate pads 111 may be provided on an upper surface 101a of the substrate 101. The upper substrate pads 111 may be electrically connected to the semiconductor chips 102 provided on the substrate 101. For example, the upper substrate pads 111 may be electrically connected to the semiconductor chips 102 by an upper connection member (not shown) interposed between the semiconductor chips 102 and the upper substrate pads 111.

In an embodiment, lower substrate pads 112 may be provided on a lower surface 101b of the substrate 101. The lower substrate pads 112 may be electrically connected to an external apparatus. For example, a lower connection member (not shown) may be formed under the lower substrate pads 112 and the lower connection member may electrically connect the lower substrate pads 112 to the external apparatus.

In an embodiment, the semiconductor apparatus 1100 may include a plurality of semiconductor chips 102. As illustrated in FIG. 11, the semiconductor apparatus 1100 may include two or more semiconductor chips 102. In accordance with a purpose of the semiconductor apparatus 1100, the semiconductor apparatus 1100 may include the same kind of semiconductor chips 102 or different kinds of semiconductor chips 102. For example, the semiconductor apparatus 1100 may include different kinds of semiconductor chips 102 and the different kinds of semiconductor chips 102 may be electrically connected to each other.

In an embodiment, the semiconductor apparatus 1100 may include stacked semiconductor chips 102. For example, the semiconductor apparatus 1100 may include semiconductor chips 102 stacked in two layers. The inventive concept is not limited thereto. The semiconductor apparatus 1100 may include semiconductor chips 102 stacked in three or more layers. In addition, the semiconductor apparatus 1100 may include single layer semiconductor chips 102.

In an embodiment, since the technical features of the semiconductor chips 102 of the semiconductor apparatus 1100 is the same as the technical features described with reference to the semiconductor chips 20 of FIG. 2, detailed description thereof is omitted.

In an embodiment, the controller 103 of the semiconductor apparatus 1100 may be mounted on the upper surface 101a of the substrate 101 and may be electrically connected to the substrate 101. In addition, the controller 103 may control the semiconductor chips 102. For example, when the semiconductor apparatus 1100 is a storage apparatus, the controller 103 may write data in the semiconductor chips 102 and may read data from the semiconductor chips 102.

In an embodiment, the semiconductor apparatus 1100 may include the housing 104. The housing 104 may include an internal wall 104a and an external wall 104b. The housing 104 may be combined with the substrate 101 and the internal wall 104a of the housing 104 may surround the semiconductor chips 102 and the controller 103. The internal wall 104a of the housing 104 may be spaced apart from upper surfaces of the semiconductor chips 102. In addition, the internal wall 104a of the housing 104 may be spaced apart from an upper surface of the controller 103.

In an embodiment, the housing 104 may include a metal material having high thermal conductivity. For example, the housing 104 may include at least one of metal materials having high thermal conductivity such as Al, Ni, Cu, Mg, and Ag.

In an embodiment, the internal PDMS layer 105 of the semiconductor apparatus 1100 may be attached to the internal wall 104a of the housing 104. For example, the internal PDMS layer 105 may be formed along the internal wall 104a of the housing 104. For example, the internal PDMS layer 105 may be attached to an upper portion and side portions of the internal wall 104a of the housing 104. The inventive concept is not limited thereto. The internal PDMS layer 105 may be attached to one of the upper and side portions of the internal wall 104a of the housing 104. In some embodiments, the internal PDMS layer 105 may be attached to the housing 104 by an adhesive film (not shown).

In an embodiment, when the semiconductor chips 102 of the semiconductor apparatus 1100 operate in the vacuum state, the internal PDMS layer 105 may partially absorb thermal energy radiated by the semiconductor chips 102. In addition, the internal PDMS layer 105 may emit the absorbed thermal energy to the outside through thermal radiation.

In an embodiment, the internal PDMS layer 105 may be formed to a thickness v5 in which thermal emissivity has a value of about 0.6 to about 1 in the IR period. In more detail, when the semiconductor chips 102 of the semiconductor apparatus 1100 operate in the vacuum state, the thickness v5 of the internal PDMS layer 105 may be determined so that the thermal emissivity of the internal PDMS layer 105 in the IR period has the value of about 0.6 to about 1. For example, the thickness v5 of the internal PDMS layer 105 may be determined so that the thermal emissivity of the internal PDMS layer 105 has the value of about 0.6 to about 1 in the period in which the wavelength of the electromagnetic wave is about 5 micrometers to about 15 micrometers.

In an embodiment, when the internal PDMS layer 105 of the semiconductor apparatus 1100 is formed to a thickness v5 of about 1 micrometer to about 300 micrometers and the semiconductor chips 102 of the semiconductor apparatus 1100 operate in the vacuum state, the internal PDMS layer 105 may have the thermal emissivity of about 0.6 to about 1 in the period in which the wavelength of the electromagnetic wave is about 5 micrometers to about 15 micrometers. In more detail, the internal PDMS layer 105 may have a thickness v5 of about 1 micrometer to about 200 micrometers.

The internal PDMS layer 105 of the semiconductor apparatus 1100 may partially absorb thermal energy emitted by the substrate 101, the semiconductor chips 102, and the controller 103. In addition, the internal PDMS layer 105 may radiate the absorbed heat to the outside of the semiconductor apparatus 1100 as the electromagnetic wave in the IR region. Therefore, the heat emitting performance of the semiconductor apparatus 1100 in the vacuum state may improve.

In an embodiment, unlike in FIG. 11, the internal PDMS layer 105 may be interposed between the side surfaces of the substrate 101 and the internal wall 104a of the housing 104. Due to high viscosity of the internal PDMS layer 105, the substrate 101 and the housing 104 may be firmly combined with each other. In addition, the internal PDMS layer 105 is interposed between the side surfaces of the substrate 101 and the internal wall 104a of the housing 104 and accordingly, the heat emitting performance of the semiconductor apparatus 1100 in the vacuum state may improve.

Figure 12:
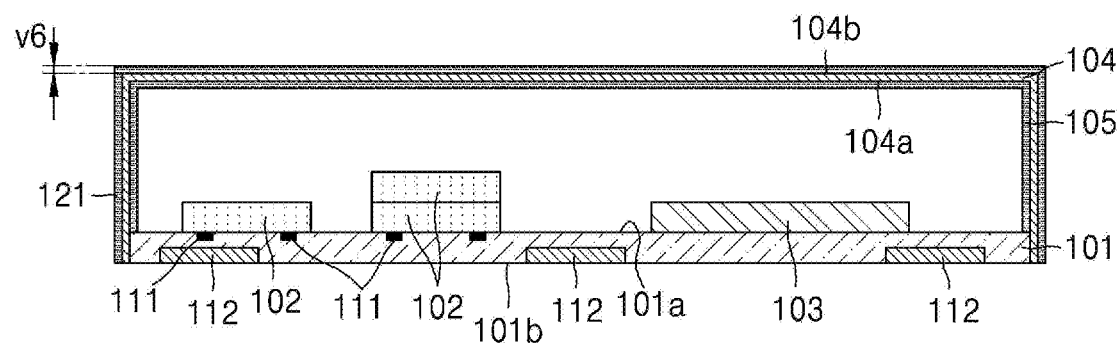

FIG. 12 is a cross-sectional view of a semiconductor apparatus 1200 according to an example embodiment of the inventive concept. In an embodiment, the semiconductor apparatus 1200 may include the substrate 101, the semiconductor chips 102, the controller 103, the housing 104, the internal PDMS layer 105, and an external PDMS layer 121.

In an embodiment, the external PDMS layer 121 of the semiconductor apparatus 1200 may be attached to the external wall 104b of the housing 104. For example, the external PDMS layer 121 may be formed along the external wall 104b of the housing 104. For example, the external PDMS layer 121 may be attached to an upper portion and side portions of the external wall 104b of the housing 104. The inventive concept is not limited thereto. The external PDMS layer 121 may be attached to one of the upper portion and side portions of the external wall 104b of the housing 104. In some embodiments, the external PDMS layer 121 may be attached to the housing 104 by an adhesive film (not shown).

In an embodiment, when the semiconductor chips 102 of the semiconductor apparatus 1200 operate in the vacuum state, the external PDMS layer 121 may receive thermal energy from the internal PDMS layer 105 heated by radiant heat of the semiconductor chips 102. The external PDMS layer 121 may emit the thermal energy to the outside of the semiconductor apparatus 1200 by the thermal radiation.

In an embodiment, when the semiconductor chips 102 of the semiconductor apparatus 1200 is formed to a thickness v6 of about 1 micrometer to about 300 micrometers, the external PDMS layer 121 may have thermal emissivity of about 0.6 to about 1 in the period in which the wavelength of the electromagnetic wave is about 5 micrometers to about 15 micrometers. In more detail, the external PDMS layer 121 may have a thickness v6 of about 1 micrometer to about 200 micrometers.

The semiconductor apparatus 1200 may include the external PDMS layer 121 and may have high light emitting performance in the vacuum state due to the thermal radiation. In addition, the semiconductor apparatus 1200 includes the external PDMS layer 121 and may have high electric insulation and durability.

In an embodiment, unlike in FIG. 12, the external PDMS layer 121 may have a concavo-convex structure. For example, the external PDMS layer 121 may have a structure in which concaveness and convexity are repeated. In some embodiments, the external PDMS layer 121 may be formed to have the concavo-convex structure on the upper portion and side portions of the external wall 104b of the housing 104. Since the technical features of the external PDMS layer 121 having the concavo-convex structure is the same as the technical features described with reference to of the PDMS layer 31 having the concavo-convex structure of FIG. 3, detailed description thereof is omitted. Since the external PDMS layer 121 may have the concavo-convex structure, the heat emitting performance of the semiconductor apparatus 1200 in the vacuum state may improve.

In an embodiment, although not shown in FIG. 12, the semiconductor apparatus 1200 may further include an internal heat sink interposed between the internal PDMS layer 105 and the housing 104. In addition, the semiconductor apparatus 1200 may further include an external heat sink interposed between the external PDMS layer 121 and the housing 104. Since the technical features of the internal heat sink and the external heat sink are the same as the technical features described with reference to the heat sink 61 of FIG. 6, detailed description thereof is omitted. Since the semiconductor apparatus 1200 may further include the external heat sink and the internal heat sink, the heat emitting performance of the semiconductor apparatus 1200 in the vacuum state may improve.

In an embodiment, although not shown in FIG. 12, the semiconductor apparatus 1200 may include a hole that passes through the internal PDMS layer 105, the housing 104, and the external PDMS layer 121. When the semiconductor apparatus 1200 operates under atmospheric pressure, heated air in the housing 104 may be emitted to the outside of the semiconductor apparatus 1200 through the hole. Therefore, the heat emitting performance of the semiconductor apparatus 1200 under atmospheric pressure may improve.

Figure 13:
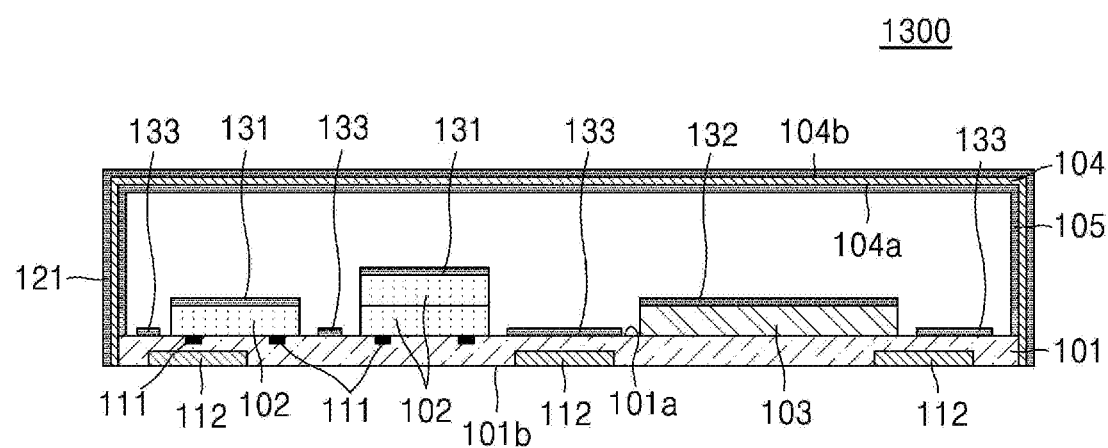

FIG. 13 is a cross-sectional view of a semiconductor apparatus 1300 according to an example embodiment of the inventive concept. The semiconductor apparatus 1300 may include the substrate 101, the semiconductor chips 102, the controller 103, the housing 104, the internal PDMS layer 105, the external PDMS layer 121, first PDMS layers 131, a second PDMS layer 132, and third PDMS layers 133.

In an embodiment, the first PDMS layers 131 may be provided on the semiconductor chips 102 and may be covered with the housing 104. For example, upper surfaces of the first PDMS layers 131 may be covered with the housing 104. In addition, the upper surfaces of the first PDMS layers 131 may face an upper portion of the internal wall of the housing 104. In some embodiments, lower surfaces of the first PDMS layer 131 may contact upper surfaces of the semiconductor chips 102. Each of the first PDMS layers 131 may be formed to a thickness of about 1 micrometer to about 300 micrometers. In more detail, each of the first PDMS layers 131 may have a thickness of about 1 micrometer to about 200 micrometers. When each of the first PDMS layers 131 is formed to the above thickness, each of the first PDMS layers 131 may have thermal emissivity of about 0.6 to about 1 in the period in which the wavelength of the electromagnetic wave is about 5 micrometers to about 15 micrometers.

In an embodiment, the second PDMS layer 132 may be provided on the controller 103 and may be covered with the housing 104. For example, an upper surface of the second PDMS layer 132 may be covered with the housing 104. In addition, the upper surface of the second PDMS layer 132 may face the upper portion of the internal wall of the housing 104. In some embodiments, the second PDMS layer 132 may contact an upper surface of the controller 103. The second PDMS layer 132 may be formed to a thickness of about 1 micrometer to about 300 micrometers. In more detail, the second PDMS layer 132 may have a thickness of about 1 micrometer to about 200 micrometers. When the second PDMS layer 132 is formed to the above thickness, the second PDMS layer 132 may have thermal emissivity of about 0.6 to about 1 in the period in which the wavelength of the electromagnetic wave is about 5 micrometers to about 15 micrometers.

In an embodiment, the third PDMS layers 133 may be attached to an upper surface of the substrate 101. In more detail, the third PDMS layers 133 may be formed in portions of the upper surface of the substrate 101, in which the semiconductor chips 102 and the controller 103 are not formed. The third PDMS layers 133 may be covered with the housing 104. For example, upper surfaces of the third PDMS layers 133 may be covered with the housing 104. In addition, the upper surfaces of the third PDMS layers 133 may face the upper portion of the internal wall of the housing 104. In some embodiments, lower surfaces of the third PDMS layers 133 may contact upper surfaces of the substrate 101. Each of the third PDMS layers 133 may be formed to a thickness of about 1 micrometer to about 300 micrometers. In more detail, each of the third PDMS layers 133 may be formed to a thickness of about 1 micrometer to about 200 micrometers. When each of the third PDMS layers 133 is formed to the above thickness, each of the third PDMS layers 133 may have thermal emissivity of about 0.6 to about 1 in the period in which the wavelength of the electromagnetic wave is about 5 micrometers to about 15 micrometers.

Since the semiconductor apparatus 1300 may include the first to third PDMS layers 131 to 133, the heat emitting performance of the semiconductor apparatus 1300 in the vacuum state may improve.

Figure 14:
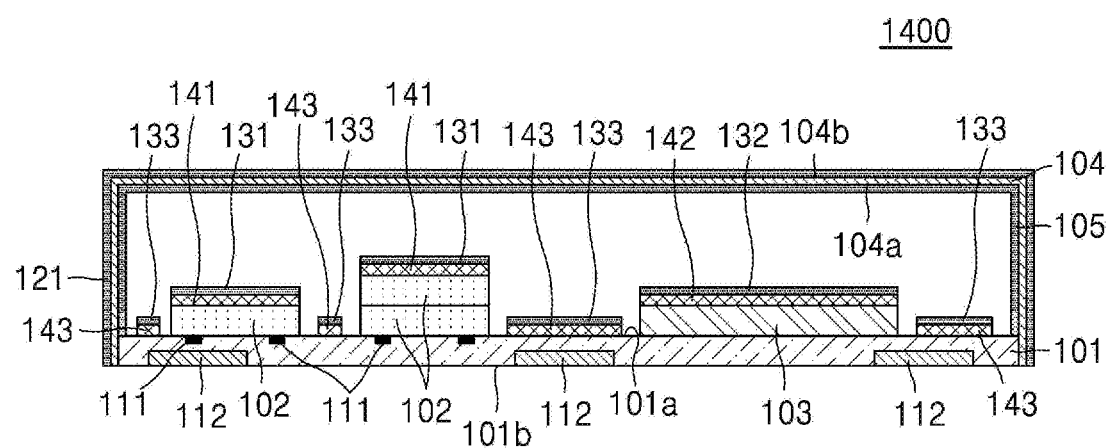

FIG. 14 is a cross-sectional view of a semiconductor apparatus 1400 according to an example embodiment of the inventive concept. In an embodiment, the semiconductor apparatus 1400 may include the substrate 101, the semiconductor chips 102, the controller 103, the housing 104, the internal PDMS layer 105, the external PDMS layer 121, the first PDMS layers 131, the second PDMS layer 132, the third PDMS layers 133, first heat sinks 141, a second heat sink 142, and third heat sinks 143.

In an embodiment, the first heat sinks 141 may be interposed between the semiconductor chips 102 and the first PDMS layers 131. When the semiconductor apparatus 1400 including the first heat sinks 141 operates in the vacuum state, each of the first PDMS layers 131 may have thermal emissivity of about 0.7 to about 1 in the period in which the wavelength of the electromagnetic wave is about 5 micrometers to about 15 micrometers.

In an embodiment, the second heat sink 142 may be interposed between the controller 103 and the second PDMS layer 132. When the semiconductor apparatus 1400 including the second heat sink 142 operates in the vacuum state, the second PDMS layer 132 may have thermal emissivity of about 0.7 to about 1 in the period in which the wavelength of the electromagnetic wave is about 5 micrometers to about 15 micrometers.

In an embodiment, the third heat sinks 143 may be interposed between the substrate 101 and the third PDMS layers 133. When the semiconductor apparatus 1400 including the third heat sinks 143 operates in the vacuum state, each of the third PDMS layers 133 may have thermal emissivity of about 0.7 to about 1 in the period in which the wavelength of the electromagnetic wave is about 5 micrometers to about 15 micrometers.

In an embodiment, since the semiconductor apparatus 1400 may include the first to third PDMS layers 131 to 133 and the first to third heat sink layers 141 to 143, the light emitting performance of the semiconductor apparatus 1400 in the vacuum state may improve. Therefore, operation stability and product reliability of the semiconductor apparatus 1400 may improve. In addition, the light emitting performance of the semiconductor apparatus 1400 of FIG. 14 in the vacuum state may be higher than that of the light emitting performance of the semiconductor apparatus 1300 of FIG. 13 in the vacuum state.

Figure 15:
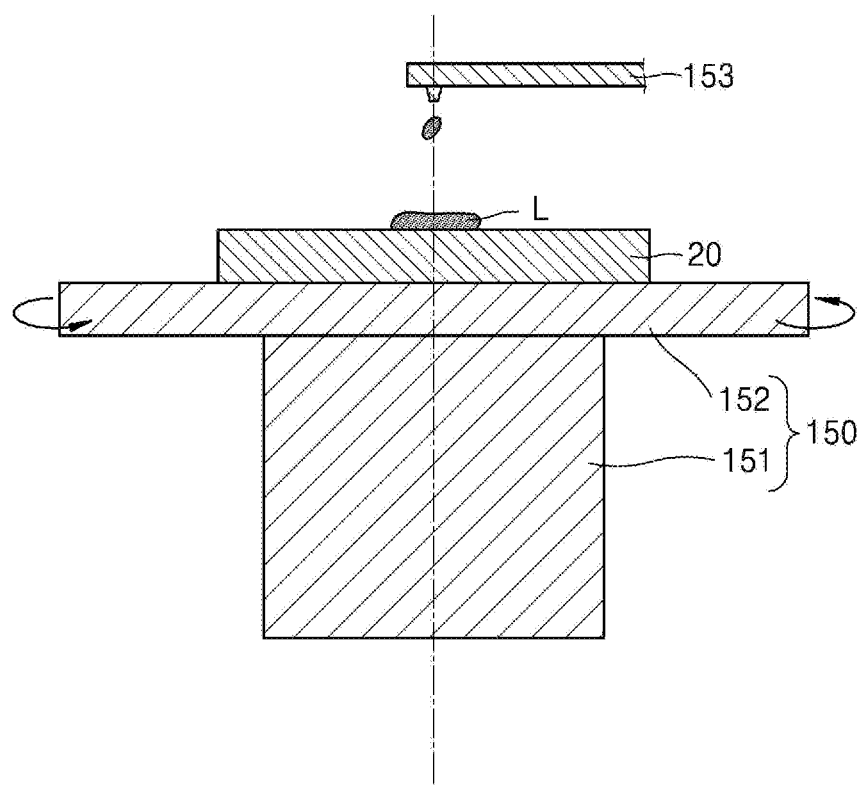
FIG. 15 is a cross-sectional view illustrating a method of forming a polydimethylsiloxane (PDMS) layer according to an example embodiment of the inventive concept.

FIG. 15 is a view illustrating a method of forming a PDMS layer. In more detail, FIG. 15 is a view illustrating a method of forming the PDMS layer 21 on the semiconductor chip 20 of the semiconductor package 200 of FIG. 2.

In an embodiment, the method of forming the PDMS layer 21 in the semiconductor package 200 may include a process of attaching the semiconductor package 200 onto a spin chuck 150. The spin chuck 150 may include a body 151 and a rotating plate 152 that may rotate about the central shaft of the body 151. The semiconductor package 200 may be attached onto an upper surface of the rotating plate 152 by an adhesive member.

In an embodiment, the method of forming the PDMS layer 21 in the semiconductor package 200 may include a process of spraying a coating solution L on the semiconductor chip 20 of the semiconductor package 200. The coating solution L may be sprayed on the semiconductor chip 20 by a nozzle 153. The coating solution L may include PDMS and a thermal curing agent. For example, the coating solution L may include PDMS and a thermal curing agent in a weight ratio of 10 to 1.

In an embodiment, the method of forming the PDMS layer 21 in the semiconductor package 200 may include a process of rotting the rotating plate 152. In accordance with revolution per minute (RPM) of the rotating plate 152, a thickness to which the PDMS layer 21 is formed may vary. For example, when the rotating plate 152 rotates at about 500 rpm, the PDMS layer 21 may be formed on the semiconductor chip 20 to a thickness of about 200 micrometers. In addition, when the rotating plate 152 rotates at about 3,000 rpm, the PDMS layer 21 may be formed on the semiconductor chip 20 to a thickness of about 20 micrometers.

In an embodiment, the method of forming the PDMS layer 21 in the semiconductor package 200 may include a process of thermal curing the semiconductor package 200 including the coating solution L. For example, the semiconductor package 200 may be heated at a temperature of about 50 degrees Celsius to about 70 degrees Celsius for about two hours to about four hours. The coating solution L is hardened by the thermal curing agent and accordingly, the PDMS layer 21 may be formed on the semiconductor chip 20.

Figure 16:
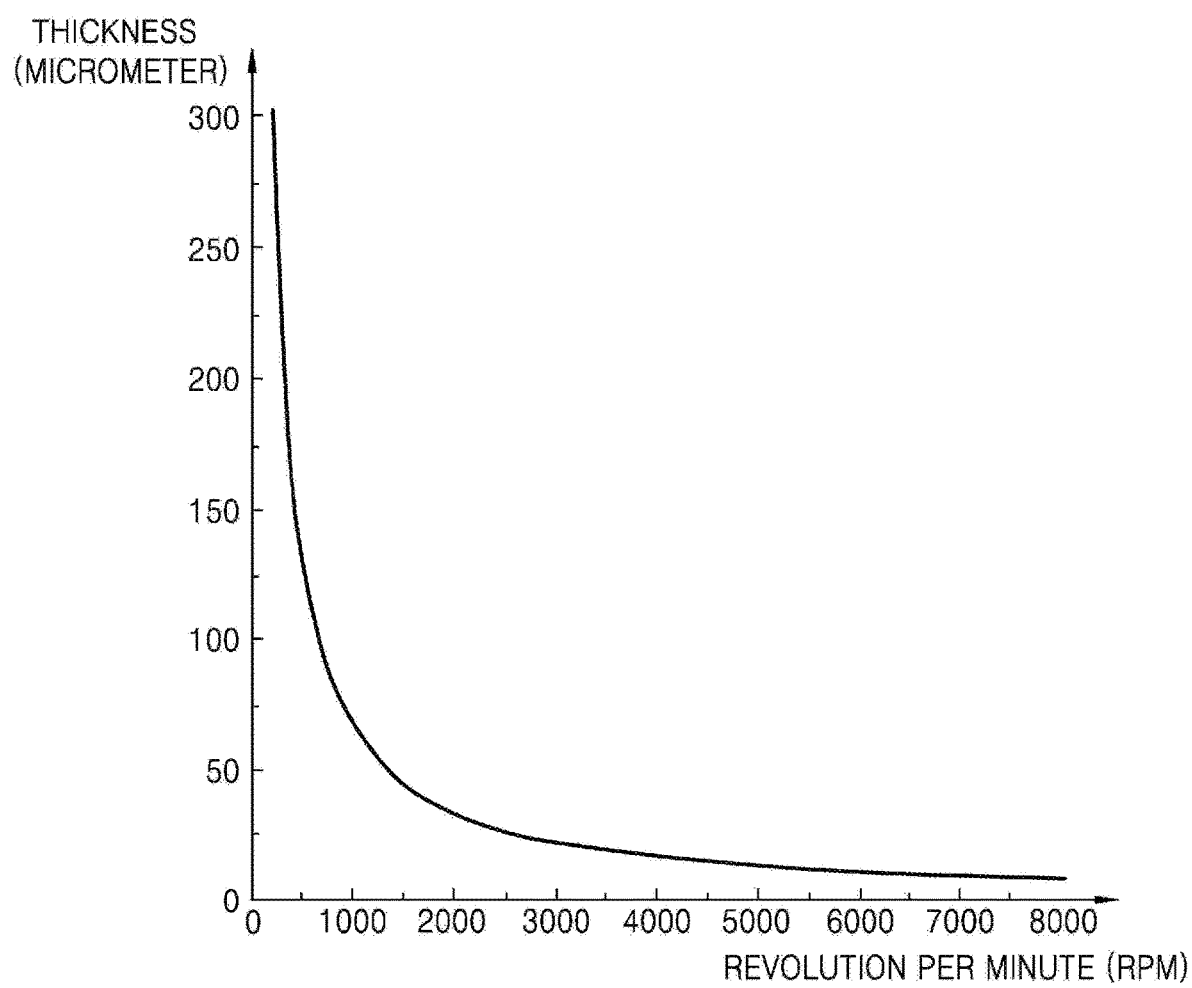
FIG. 16 is a graph illustrating a thickness of a PDMS layer formed in accordance with revolution per minute (RPM) of a rotating plate of a spin chuck.

FIG. 16 is a graph illustrating a thickness of the PDMS layer 21 in accordance with the RPM of the rotating plate 152 of the spin chuck 150.

Referring to FIG. 16 together with FIG. 15, the RPM of the rotating plate 152 may be inversely proportional to the thickness of the PDMS layer 21. In more detail, when the RPM of the rotating plate 152 is greater, the thickness of the PDMS layer 21 may be smaller. In addition, when the RPM of the rotating plate 152 is smaller, the thickness of the PDMS layer 21 may be greater.

In an embodiment, using data on an amount of the coating solution L sprayed on the semiconductor package 200 and the thickness of the PDMS layer 21 in accordance with the RPM of the rotating plate, a plurality of semiconductor packages 200 each including the PDMS layer 21 of a uniform thickness may be manufactured.

FIGS. 17 to 21 are views illustrating a method of forming a PDMS layer according to an embodiment of the inventive concept. In more detail, FIGS. 17 to 21 are views illustrating a method of forming the PDMS layer 84 on the heat sink 81 of the semiconductor package 800 of FIG. 8.

Figure 17:
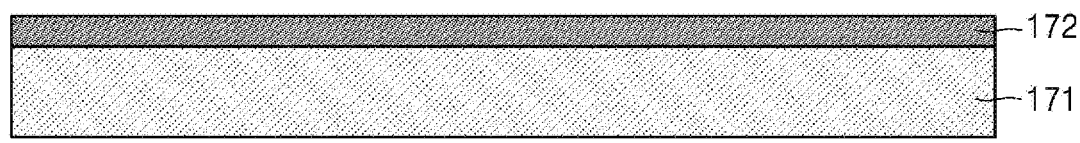
FIGS. 17 to 21 are views illustrating a method of forming a PDMS layer according to an example embodiment of the inventive concept.

Referring to FIG. 17, the method of forming the PDMS layer 84 on the heat sink 81 of the semiconductor package 800 may include a process of forming a polymer layer 172 on a silicon substrate 171. The polymer layer 172 may be a water soluble polymer layer dissolved into water.

Figure 18:
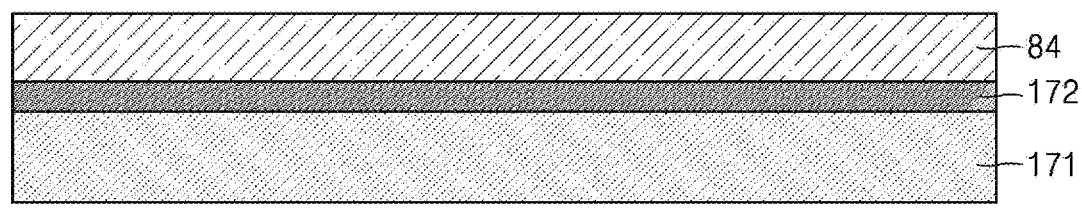

Referring to FIG. 18, the method of forming the PDMS layer 84 in the semiconductor package 800 may include a process of forming the PDMS layer 84 on the polymer layer 172. Since technical features of the process of forming the PDMS layer 84 on the polymer layer 172 may be the same as the technical features described with reference to the process of forming the PDMS layer 21 on the semiconductor chip 20 of FIG. 15, detailed description thereof is omitted.

Figure 19:
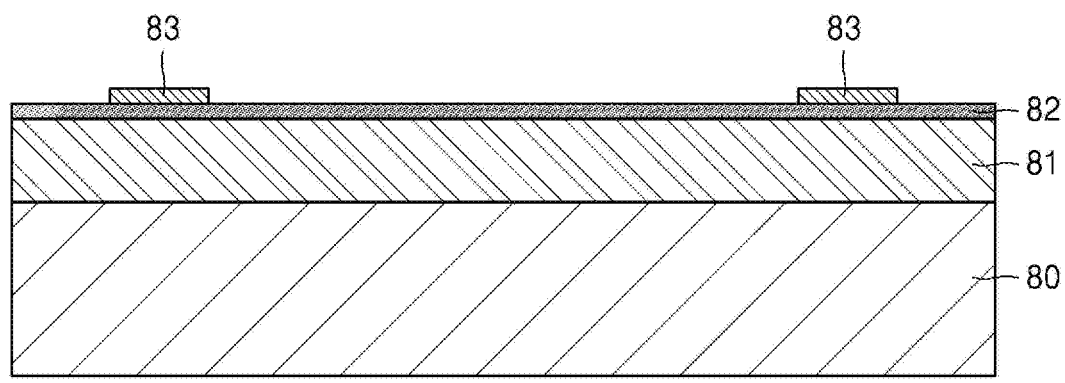

Referring to FIG. 19, the method of forming the PDMS layer 84 in the semiconductor package 800 may include a process of forming the heat sink 81 on the semiconductor chip 80, and a process of forming the primer 82 on the heat sink 81. The primer 82 may be coated on an upper surface 81a of the heat sink 81. The primer 82 may make a surface of the upper surface 81a of the heat sink 81 even. In addition, when the primer 82 is coated on the upper surface 81a of the heat sink 81, the primer 82 may remove impurities on the upper surface 81a of the heat sink 81.

In an embodiment, the method of forming the PDMS layer 84 in the semiconductor package 800 may include a process of attaching adhesives 83 onto the primer 82. The adhesives 83 may include a silicon adhesive, for example, a thermoset silicon adhesive.

Figure 20:
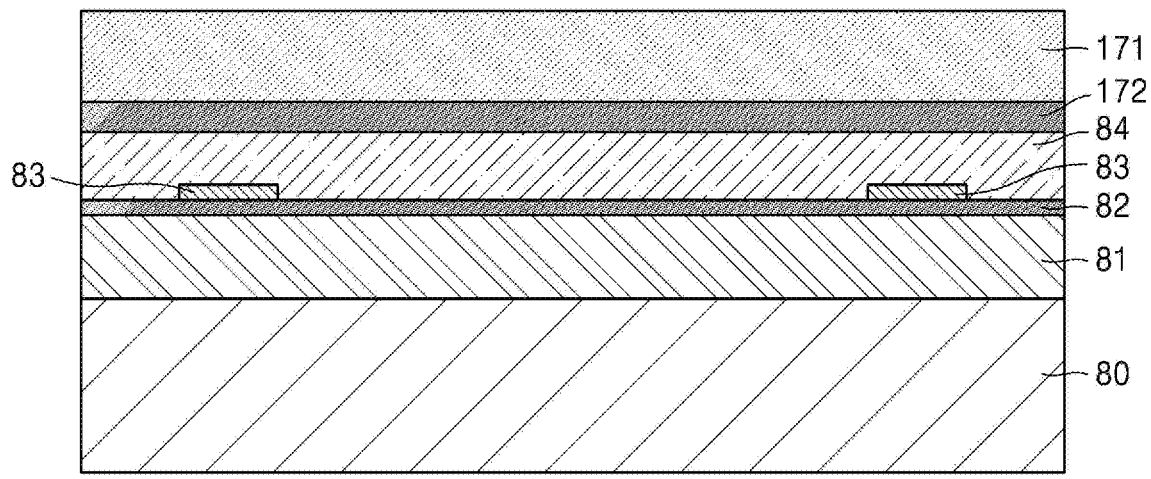

Referring to FIG. 20, the method of forming the PDMS layer 84 in the semiconductor package 800 may include a process of attaching the PDMS layer 84 formed on the silicon substrate 171 to the heat sink 81. In more detail, the PDMS layer 84 formed on the silicon substrate 171 may be attached to the primer 82 on the heat sink 81 by the adhesives 83. At this time, the adhesives 83 may be buried in the PDMS layer 84 and the adhesives 83 may not be exposed to the outside of the semiconductor package 800.

In an embodiment, the method of forming the PDMS layer 84 in the semiconductor package 800 may include a process of thermal curing the semiconductor package 800. By the thermal curing process, the PDMS layer 84 may be firmly attached onto the heat sink 81.

Figure 21:
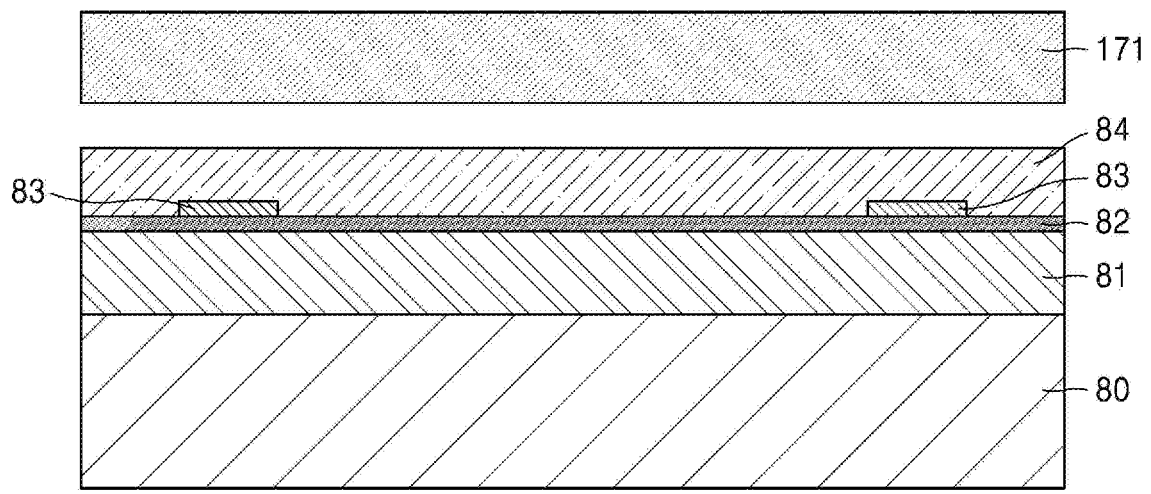

Referring to FIG. 21, the method of forming the PDMS layer 84 in the semiconductor package 800 may include a process of dissolving the polymer layer 172 into water. The polymer layer 172 is dissolved into water and accordingly, the silicon substrate 171 may be easily detached from the semiconductor package 800.

While the inventive concept has been particularly shown and described with reference to embodiments thereof, it will be understood that various changes in form and details may be made therein without departing from the spirit and scope of the following claims.

What is claimed is:

1. A semiconductor package comprising:
a semiconductor chip; and
a polydimethylsiloxane (PDMS) layer that is provided on an upper surface of the semiconductor chip,
wherein a lower surface of the PDMS layer faces the upper surface of the semiconductor chip and an upper surface of the PDMS layer is exposed to an outside of the semiconductor package.

2. The semiconductor package of claim 1,
wherein the PDMS layer has a thickness of 1 micrometer to 300 micrometers.

3. The semiconductor package of claim 2,
wherein side surfaces of the PDMS layer are self-aligned with side surfaces of the semiconductor chip, and
wherein the PDMS layer has a thickness of 1 micrometer to 200 micrometers.

4. The semiconductor package of claim 1, further comprising:
a primer on the semiconductor chip; and
adhesives on the primer,
wherein the PDMS layer is provided on the primer, and
wherein the adhesives are buried in the PDMS layer.

5. The semiconductor package of claim 1,
wherein the PDMS layer has a concavo-convex structure.

6. The semiconductor package of claim 1, further comprising:
a molding material surrounding side surfaces of the semiconductor chip;
a redistribution layer formed on a lower surface of the semiconductor chip; and
external connection terminals electrically connected to the redistribution layer,
wherein an area of the lower surface of the PDMS layer is greater than an area of the upper surface of the semiconductor chip.

7. A semiconductor package comprising:
a semiconductor chip;
a heat sink on an upper surface of the semiconductor chip; and
a polydimethylsiloxane (PDMS) layer that is provided on the heat sink,
wherein the heat sink is interposed between the semiconductor chip and the PDMS layer, and
wherein an upper surface of the PDMS layer is exposed to an outside of the semiconductor package.

8. The semiconductor package of claim 7,
wherein the PDMS layer is formed to a thickness of 1 micrometer to 300 micrometers.

9. The semiconductor package of claim 8,
wherein side surfaces of the heat sink are provided on inner sides in comparison with side surfaces of the semiconductor chip,
wherein side surfaces of the PDMS layer are self-aligned with side surfaces of the heat sink, and
wherein the PDMS layer is formed to a thickness of 1 micrometer to 200 micrometers.

10. The semiconductor package of claim 7, further comprising:
a primer on the heat sink; and
adhesives on the primer,
wherein the PDMS layer is provided on the primer, and
wherein the adhesives comprise a thermoset silicon adhesive and are buried in the PDMS layer.

11. The semiconductor package of claim 7,
wherein a surface area of an upper surface of the PDMS layer is greater than a surface area of a lower surface of the PDMS layer.

12. The semiconductor package of claim 7, further comprising:
a molding material surrounding side surfaces of the semiconductor chip;
a redistribution layer formed on a lower surface of the semiconductor chip; and
external connection terminals electrically connected to the redistribution layer,
wherein an area of a lower surface of the PDMS layer is greater than an area of the upper surface of the semiconductor chip and is equal to that of an upper surface of the heat sink.

13. A semiconductor apparatus comprising:
a substrate;
semiconductor chips mounted on an upper surface of the substrate;
a controller mounted on the upper surface of the substrate and configured to control the semiconductor chips;
a housing configured to surround the semiconductor chips and the controller; and
an internal polydimethylsiloxane (PDMS) layer on an internal wall of the housing.

14. The semiconductor apparatus of claim 13,
wherein the internal PDMS layer is formed to a thickness of 1 micrometer to 300 micrometers, and
wherein the internal PDMS layer is interposed between side surfaces of the substrate and the internal wall of the housing.

15. The semiconductor apparatus of claim 13, further comprising:
an external polydimethylsiloxane (PDMS) layer on an external wall of the housing,
wherein the external PDMS layer is formed to a thickness of 1 micrometer to 300 micrometers.

16. The semiconductor apparatus of claim 13, further comprising:
a first PDMS layer that is provided on the semiconductor chips,
wherein an upper surface of the first PDMS layer is covered with the housing, and
wherein the first PDMS layer has a thickness of 1 micrometer to 300 micrometers.

17. The semiconductor apparatus of claim 13, further comprising:
a first PDMS layer that is provided on the controller,
wherein an upper surface of the first PDMS layer is covered with the housing, and
wherein the first PDMS layer has a thickness of 1 micrometer to 300 micrometers.

18. The semiconductor apparatus of claim 17, further comprising:
a heat sink interposed between the controller and the first PDMS layer.

19. The semiconductor apparatus of claim 13, further comprising:
a first PDMS layer that is provided on the substrate,
wherein an upper surface of the first PDMS layer is covered with the housing, and
wherein the first PDMS layer has a thickness of 1 micrometer to 300 micrometers.

20. The semiconductor apparatus of claim 13, wherein the semiconductor apparatus is mounted in an apparatus operated in a vacuum state.

\* \* \* \* \*